US 8,466,038 B2

(12) United States Patent
Chapelon et al.

(10) Patent No.: US 8,466,038 B2
(45) Date of Patent: Jun. 18, 2013

(54) PROCESS FOR FABRICATING INTEGRATED-CIRCUIT CHIPS

(75) Inventors: Laurent-Luc Chapelon, Domene (FR); Julien Cuzzocrea, Grenoble (FR)

(73) Assignee: STMicroelectronics (Crolles 2) SAS, Crolles Cedex (FR)

(*) Notice: Subject to any disclaimer, the term of this patent is extended or adjusted under 35 U.S.C. 154(b) by 0 days.

(21) Appl. No.: 13/315,456

(22) Filed: Dec. 9, 2011

(65) Prior Publication Data
US 2012/0156859 A1 Jun. 21, 2012

(30) Foreign Application Priority Data

Dec. 16, 2010 (FR) ...................................... 10 60640

(51) Int. Cl.
*H01L 21/30* (2006.01)
*H01L 21/20* (2006.01)

(52) U.S. Cl.
USPC ................ 438/458; 438/455; 257/E21.001

(58) Field of Classification Search
USPC ................................................. 438/455–458
See application file for complete search history.

(56) References Cited

U.S. PATENT DOCUMENTS

| | | | |
|---|---|---|---|
| 5,925,924 A | 7/1999 | Cronin et al. | |
| 6,107,213 A * | 8/2000 | Tayanaka | 438/762 |
| 6,326,279 B1 * | 12/2001 | Kakizaki et al. | 438/406 |
| 6,331,208 B1 * | 12/2001 | Nishida et al. | 117/89 |
| 6,426,235 B1 * | 7/2002 | Matsushita et al. | 438/22 |
| 6,551,905 B1 | 4/2003 | Barsky et al. | |
| 6,605,518 B1 * | 8/2003 | Ohmi et al. | 438/458 |
| 6,649,485 B2 * | 11/2003 | Solanki et al. | 438/409 |
| 7,033,863 B2 | 4/2006 | Tokushige | |
| 7,157,352 B2 * | 1/2007 | Yamanaka | 438/458 |
| 7,935,571 B2 * | 5/2011 | Ramiah et al. | 438/108 |
| 8,394,677 B2 * | 3/2013 | Sakurada | 438/113 |
| 2005/0052219 A1 | 3/2005 | Butler et al. | |
| 2006/0043534 A1 | 3/2006 | Kirby et al. | |
| 2006/0138629 A1 | 6/2006 | Fukazawa | |
| 2006/0205161 A1 | 9/2006 | Das et al. | |
| 2007/0200877 A1 * | 8/2007 | Arakawa | 347/1 |
| 2011/0300715 A1 * | 12/2011 | Ravi et al. | 438/753 |

FOREIGN PATENT DOCUMENTS

EP 1439577 A2 7/2004

OTHER PUBLICATIONS

French Search Report and Written Opinion for FR 1060640 dated Aug. 16, 2011 (7 pages).

* cited by examiner

Primary Examiner — Scott B. Geyer
Assistant Examiner — Evren Seven
(74) Attorney, Agent, or Firm — Gardere Wynne Sewell LLP

(57) ABSTRACT

Front-side integrated parts of integrated-circuit chips are produced at locations on a substrate wafer. The front-side parts have a front side. A support wafer having a bearing side is mounted with the bearing side on top of said front-side parts. The support wafer includes at least one weak surface layer. This weak surface layer is attached to the substrate wafer using a retaining adhesive. In one implementation, the weak surface layer is attached to a front surface of the wafer. In another implementation, the weak surface layer is attached to a peripheral edge of the wafer. After attaching the support wafer, back-side integrated parts of the integrated-circuit chips are produced on the substrate wafer. The weak surface layer is then destroyed so as to demount the support wafer from the substrate wafer.

21 Claims, 4 Drawing Sheets

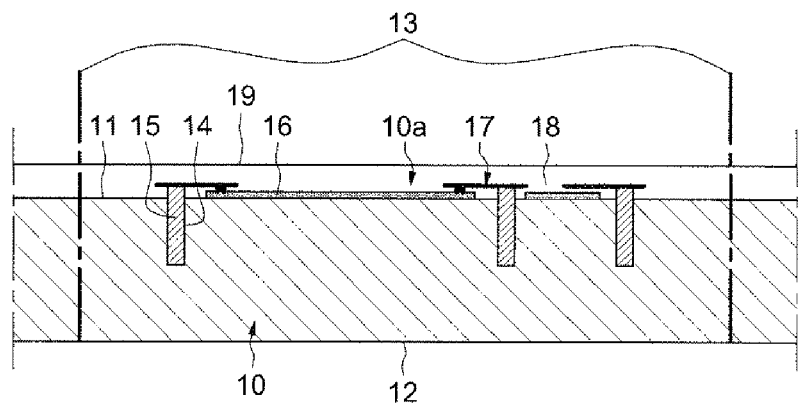
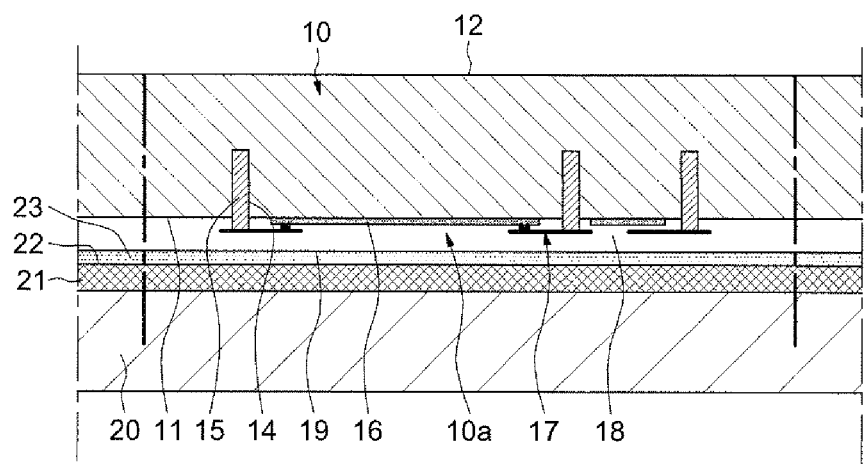
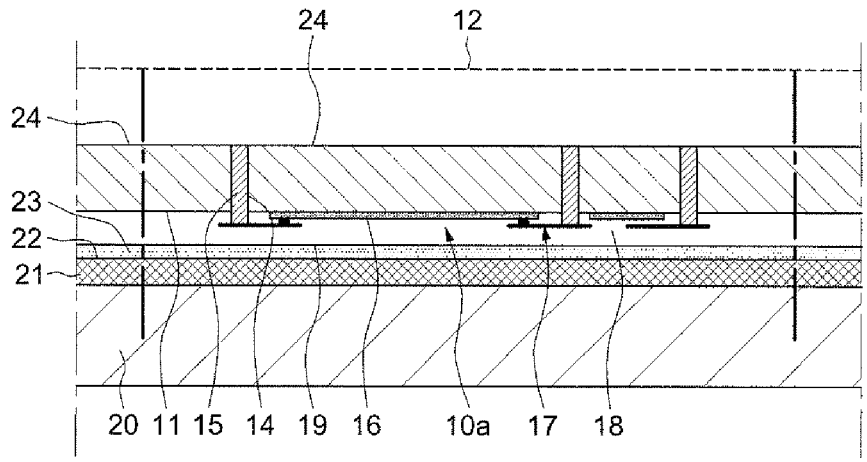

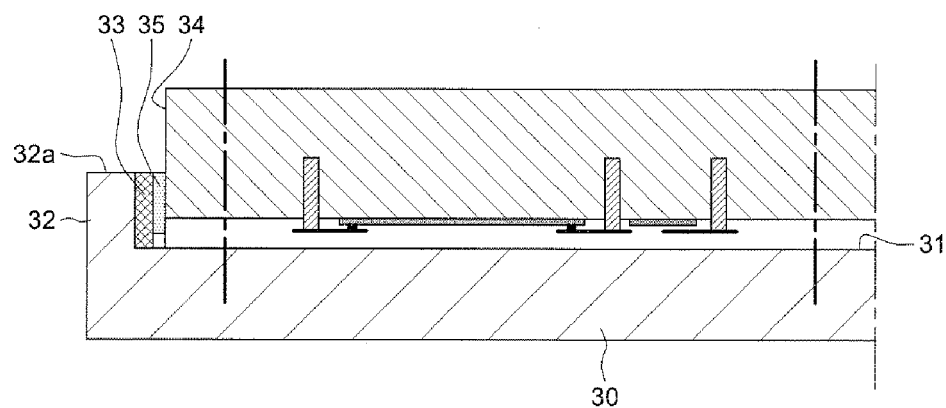
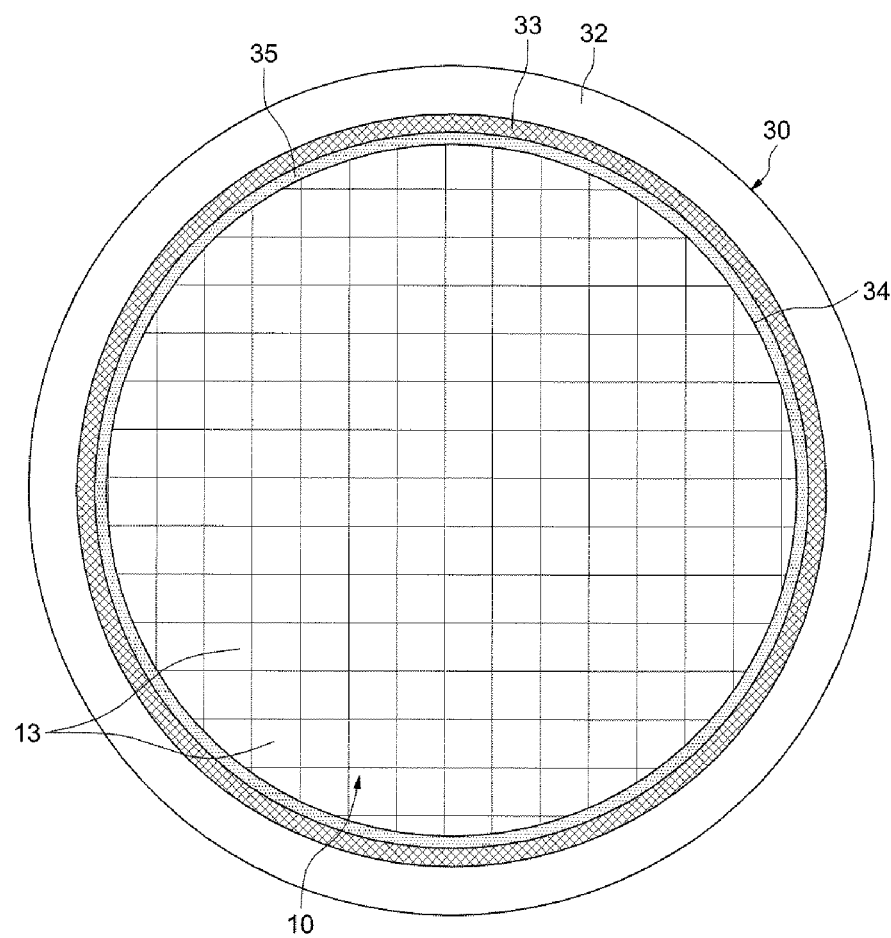

PROCESS FOR FABRICATING
INTEGRATED-CIRCUIT CHIPS

PRIORITY CLAIM

This application claims priority from French Application for Patent No. 1060640 filed Dec. 16, 2010, the disclosure of which is hereby incorporated by reference.

TECHNICAL FIELD

The present invention relates to the field of integrated-circuit chips and to their fabrication processes.

BACKGROUND

When integrated-circuit chips are produced by wafer-scale fabrication, use is often made of reinforcing support wafers, often called carriers, which are fixed by way of adhesive layers. There is in particular a difficulty related to demounting these support wafers, because it is generally necessary to heat the adhesive layers and to act mechanically on the support wafers so as to make them slide and to remove them.

SUMMARY

According to one embodiment, a fabrication process is provided that obviates at least partially the aforementioned drawbacks.

A process is provided for fabricating integrated-circuit chips, which comprises: producing front-side integrated parts of integrated-circuit chips in locations on a thick substrate wafer, said front-side parts having a front side; mounting a support wafer comprising a bearing side placed on top of said front-side parts, this support wafer comprising a weak surface layer by way of which the mounting is fixed; producing back-side integrated parts of the integrated-circuit chips in locations on the thinned substrate wafer; and destroying said weak surface layer so as to demount the support wafer.

The weak surface layer of the support wafer may lie above said front-side integrated parts of the integrated-circuit chips and the retaining adhesive may be interposed between the weak surface layer and the front side of said front-side integrated parts of the integrated-circuit chips.

The weak surface layer of the support wafer may extend around the periphery of the substrate wafer and a peripheral layer of retaining adhesive may be interposed between this weak surface layer, said front-side integrated parts of the integrated-circuit chips possibly having a front side that bears against the bearing side of the support wafer.

The process may comprise, after the support wafer has been mounted and before the back-side integrated parts have been produced: thinning the substrate wafer by way of its back side.

The process may comprise: producing, by way of the front side and/or by way of the back side, electrical connection vias that pass through the substrate wafer and connect the front-side integrated parts and the back-side integrated parts of the integrated-circuit chips.

The process may comprise: producing front-side integrated parts of the integrated-circuit chips comprising integrated circuits and front-side electrical interconnect networks; and producing back-side integrated parts of the integrated-circuit chips comprising external electrical connection means.

The support wafer may comprise a silicon wafer and the weak surface layer may comprise porous silicon resulting from an electrochemical etch of this silicon wafer.

BRIEF DESCRIPTION OF THE DRAWINGS

Methods for fabricating integrated-circuit chips will now be described by way of non-limiting example, illustrated by the drawings in which:

FIGS. 1 to 5 show cross sections through integrated-circuit chips during fabrication, in various fabrication steps;

FIGS. 6 and 8 to 10 show cross sections through integrated-circuit chips during fabrication, in various other fabrication steps; and FIG. 7 shows a top view of FIG. 6.

DETAILED DESCRIPTION OF THE DRAWINGS

Figure 4:
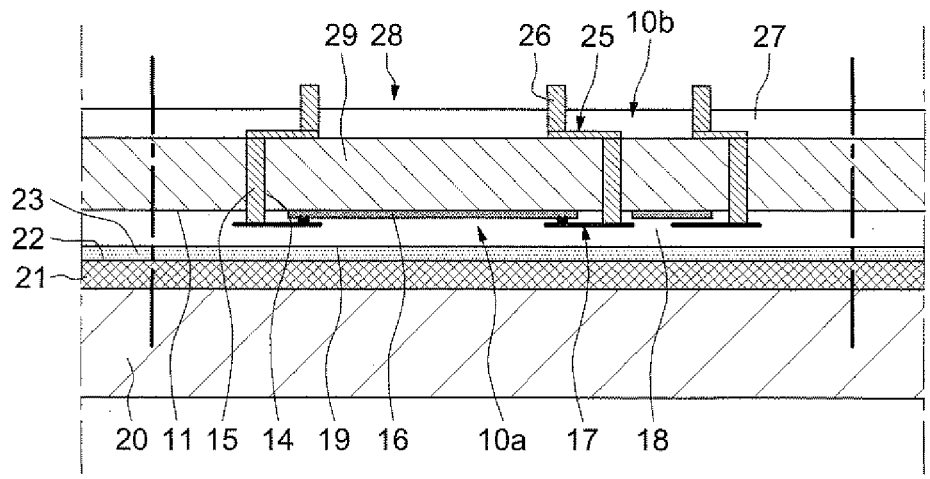

With regard to FIGS. 1 to 5, one embodiment for the wafer-scale fabrication of integrated-circuit chips will now be described.

As illustrated in FIG. 1, a thick substrate wafer 10 is provided, having a front side 11 and a back side 12.

Front-side integrated parts 10*a* are produced in locations 13 on the substrate wafer 10.

Blind holes 14 are for example produced extending from its front side 11, and an electrically conductive material is inserted into these holes so as to form electrical connection vias 15.

Next, for example, front-side parts comprising integrated circuits 16 and front-side electrical connection networks 17 are produced in locations 13 on the front side 11 of the substrate wafer 10 in a front-side layer 18 having a front side 19, these front-side electrical interconnect networks 17 selectively connecting the electrical connection vias 15 and the integrated circuits 16. The electrical connection vias 15 may for example be connected to the first metallization levels of the electrical interconnect networks 17.

In one variant embodiment, it would be possible to produce the integrated circuits 16 and then the electrical connection vias 15 and the front-side electrical interconnect networks 17 at the same time as the front-side layer 18.

Next, as illustrated in FIG. 2, the substrate wafer 10 is mounted on a front-side support wafer 20 having a weak back-side surface layer 21 that has a bearing back side 22, in a position such that the weak surface layer 21 faces the front side 19 of the front-side layer 18, by interposing a retaining adhesive layer 23 that therefore lies between the front side 19 of the front-side layer 18 and the bearing back side 22 of the front-side support wafer 20, whether totally or in various places.

The support wafer 20 is for example silicon and the weak surface layer 21 may be formed by porous silicon resulting from a suitable electrochemical etch (by electrolysis in a hydrofluoric acid electrolyte) of the silicon through holes in a mask. The weak surface layer 21 made of porous silicon could be formed over parts of the area of the support wafer 20.

Next, as illustrated in FIG. 3, the substrate wafer 10 is thinned by way of its back side 12 until the electrical connection vias 15 are uncovered on the back side. It follows that the electrical connection vias 15 pass through the thinned substrate wafer 10 that then has a back side 24. Chemical-mechanical polishing may be used to carry out this thinning.

Next, as illustrated in FIG. 4, back-side integrated parts 10*b* are produced in the locations 13.

These back-side integrated parts 10*b* may comprise back-side external electrical connection means 25 on the back side 24 of the thinned substrate wafer 10, by selectively connecting, on the back side, these back-side external electrical connection means 25 to the electrical connection vias 15. These back-side external electrical connection means 25 may comprise electrical connection studs or bumps 26 that protrude relative to a back-side integration layer 27.

Thus a wafer of integrated-circuit chips 28 is obtained which respectively comprise in locations 13 portions 29 of the thinned substrate wafer 10, the front-side integrated parts 10a formed by the integrated circuits 16, the electrical interconnect networks 17 interconnecting with portions of the front-side layer 18, the back-side integrated parts 10b formed by the back-side electrical connection means 25 connecting with portions of the back-side layer 27 and corresponding electrical connection through-vias 18.

According to one variant embodiment, the electrical connection vias 15 may be produced after thinning the substrate wafer 10.

To do this, through-holes 14 are produced by way of the back side through the thinned substrate wafer 10, for example down to the first metallization level of the front-side interconnect networks 17, and a conductive material is inserted into these holes 14 so as to form the electrical connection vias 15. Next, back-side external electrical connection means 25 are produced.

Figure 5:
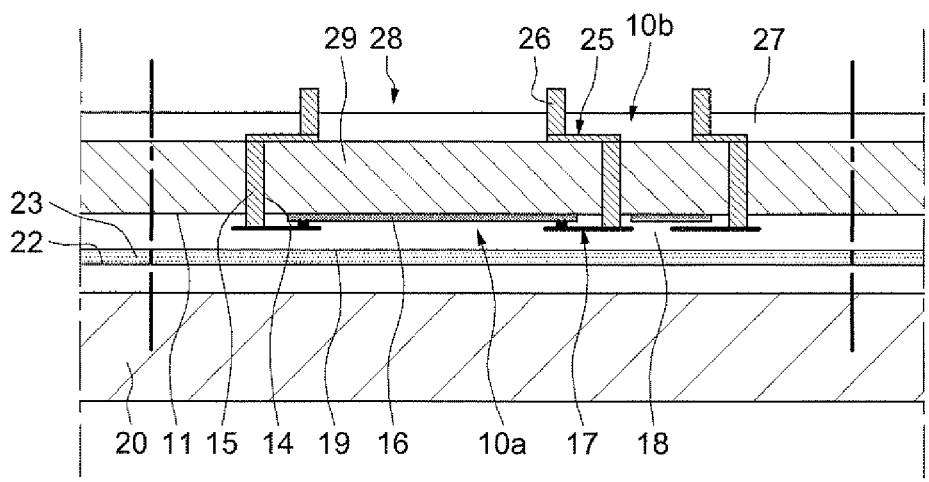

Next, as illustrated in FIG. 5, the weak surface layer 21 is destroyed, so as to demount the support wafer 20. To do this, it is possible to chemically etch the weak surface layer 21, for example by immersing the whole assembly in a potassium hydroxide solution, the chemical etchant reaching the weak surface layer 21 by way of its peripheral edge.

In one variant embodiment, the support wafer 20 may have through-holes distributed such that the etching product may reach the weak surface layer 21 in various places over its area.

In one variant embodiment, before destroying the surface layer 21, it is possible to mount, if required, a back-side transfer wafer on the side of the back-side layer 27, this transfer wafer possibly being provided with an adhesive layer onto which the back-side ends of the studs or bumps 26 are bonded.

Next, if required, it is possible to clean the front side 19 so as to remove the adhesive 23.

Next, the integrated-circuit chips 28 may be singulated, for example by sawing through the wafer of integrated-circuit chips 28 along separating lines that pass between the locations 13.

With regard to FIGS. 6 to 10, another embodiment will now be described for the wafer-scale fabrication of integrated-circuit chips, the references used being the same as those employed in the example given with reference to FIGS. 1 to 5.

As illustrated in FIGS. 6 and 7, given the thick, for example circular, substrate wafer 10 provided with front-side integrated parts 10a, back-side integrated parts 10b and electrical connection vias 15, as shown in FIG. 1 of the preceding example, a support wafer 30 is mounted in the following manner.

The support wafer 30 has a back-side bearing area 31, against which the front side 19 of the front-side layer 18 bears.

The support wafer 30 has a peripheral rim 32 protruding relative to its back-side bearing area 31, which rim surrounds the substrate wafer 10 and the front-side layer 18 and inside of which the substrate wafer 10 and front-side layer 18 are inserted. This peripheral rim 32 has a weak internal surface layer 33 that surrounds the peripheral edge face 34 of the substrate wafer 10 and of the front-side layer 18. The weak surface layer 21 may extend over all or some of the internal periphery of the rim 32. According to a variant embodiment, the peripheral rim 32 could comprise peripheral portions.

An annular retaining adhesive layer 35 is interposed between the weak internal surface layer 33 and the peripheral edge face 34; this adhesive layer 35 does not extend as far as the bearing area 31.

Figure 8:
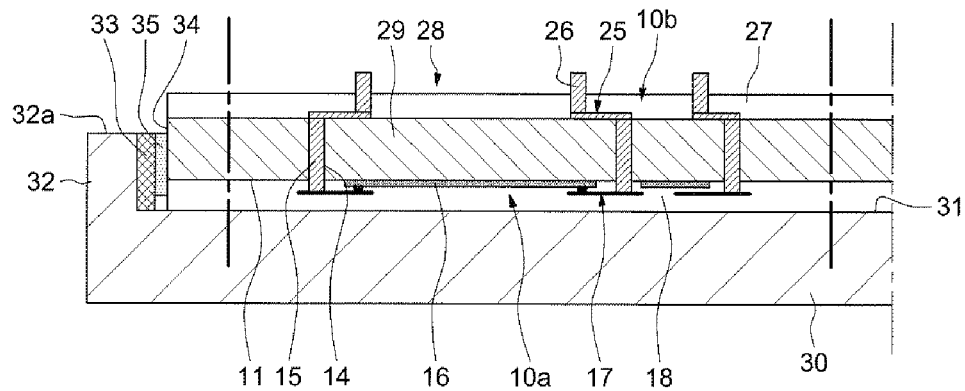

Next, as illustrated in FIG. 8, equivalently to FIG. 3, the substrate wafer 10 is thinned by way of the back side so as to uncover, at the back side, the electrical connection vias 15, thus obtaining a back side 24.

Advantageously, this back-side area 24 lies in a plane that passes above and away from the end 32a of the protruding rim 32 of the support wafer 20.

Next, equivalently to FIG. 4, electrical connection means 25 are produced in a back-side layer 27, the electrical connection means 25 comprising electrical connection studs or bumps 26 protruding relative to the back-side layer 27.

Thus, as above, a wafer of integrated-circuit chips 28 is obtained in the locations 13.

Figure 9:
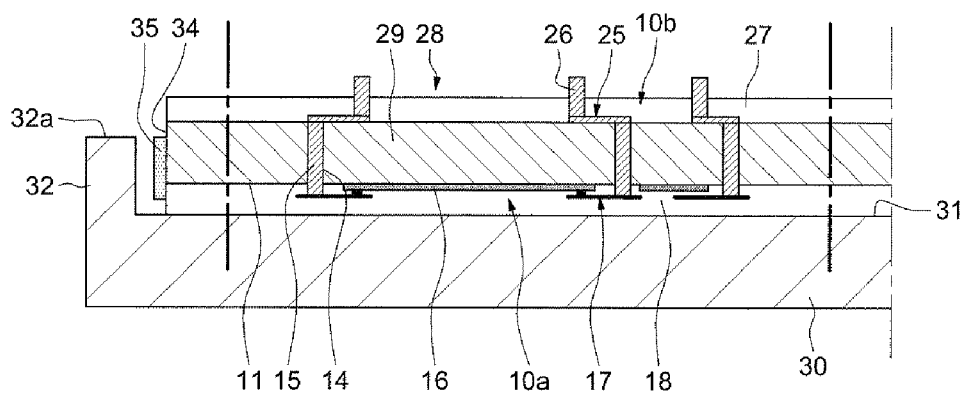

Next, as illustrated in FIG. 9, equivalently to FIG. 5, the weak surface layer 33 is destroyed by chemical etching, for example by immersing the whole assembly in a bath so as to detach the wafer 30 supporting the wafer of integrated-circuit chips 28.

Figure 10:
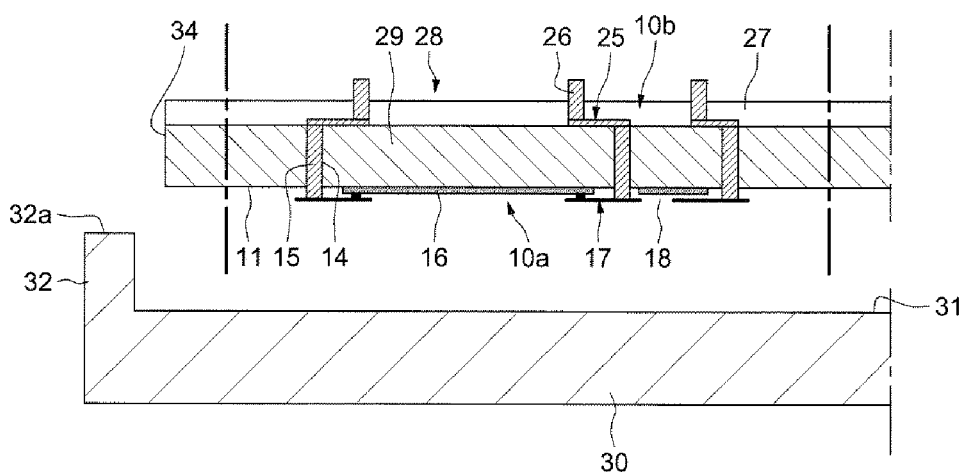

Next, as illustrated in FIG. 10, the support wafer 30 and the wafer of integrated-circuit chips 28 are separated by extracting the said support wafer from the hollow created by the peripheral rim 32 surrounding the bearing side 31 of the support wafer 30.

It follows from the above that mounting and demounting of the support wafers is facilitated and that, more particularly, demounting may be carried out statically, i.e. without stressing the fabricated wafers of integrated-circuit chips.

The present invention is not limited to the examples described above. In particular, the structural and functional features of the fabrication methods and of the integrated-circuit chips may be combined differently. Many other variant embodiments are possible without departing from the scope defined by the appended claims.

What is claimed is:

1. A process, comprising:
   producing front-side integrated parts of integrated-circuit chips in locations on a substrate wafer;
   producing a front-side interconnection network over said front-side integrated parts having a front side;
   mounting a support wafer of silicon comprising a bearing side placed on top of said front-side interconnection network, this support wafer comprising a weak surface layer of porous silicon, wherein said weak surface layer of porous silicon is attached to the front-side interconnection network by an adhesive layer;
   producing back-side integrated parts of the integrated-circuit chips in locations on the substrate wafer; and
   destroying said weak surface layer so as to demount the support wafer.

2. The process according to claim 1, wherein the weak surface layer of the support wafer lies above said front-side interconnection network and the adhesive layer is interposed between the weak surface layer and the front side.

3. The process according to claim 1, wherein the weak surface layer of the support wafer extends on an inner circumference of a raised rim of the substrate wafer and the adhesive layer comprises a peripheral layer of retaining adhesive interposed between the weak surface layer and an outer peripheral edge of the substrate wafer.

4. The process according to claim 3, wherein said front side bears against the bearing side of the support wafer.

5. The process according to claim 1, further comprising, after the support wafer has been mounted and before the back-side integrated parts have been produced: thinning the substrate wafer by way of its back side.

6. The process according to claim 1, further comprising: producing, by way of the front side, electrical connection vias that pass through the substrate wafer and connect the front-side integrated parts and the back-side integrated parts of the integrated-circuit chips.

7. The process according to claim 1, further comprising: producing, by way of the back side, electrical connection vias that pass through the substrate wafer and connect the front-side integrated parts and the back-side integrated parts of the integrated-circuit chips.

8. The process according to claim 1, wherein producing front-side integrated parts of the integrated-circuit chips comprises producing integrated circuits and front-side electrical interconnect networks; and wherein producing back-side integrated parts of the integrated-circuit chips comprises producing external electrical connections.

9. The process according to claim 1, wherein the weak surface layer is mounted to a front-side layer of the substrate wafer.

10. The process according to claim 1, wherein destroying comprises performing an electrochemical etch on the silicon wafer to remove the porous silicon weak surface layer.

11. A process, comprising:
producing front-side parts for integrated-circuit chips at locations on a substrate wafer, said front-side parts having a front side;
attaching a support wafer of silicon having a weak surface layer of porous silicon to the front-side parts with an interposed adhesive layer, said attaching comprising adhering a bearing side of the weak surface layer to said front-side parts with the adhesive layer;
processing a back side of the substrate wafer;
destroying the weak surface layer of the support wafer so as to demount the support wafer from the substrate wafer and adhesive layer; and
cleaning the substrate wafer by removing the adhesive layer.

12. The process of claim 11, wherein processing the back side of the substrate wafer comprises thinning the substrate wafer from the back side.

13. The process of claim 11, wherein processing the back side of the substrate wafer comprises forming vias from the back side.

14. The process of claim 11, wherein processing the back side of the substrate wafer comprises producing back-side parts of the integrated-circuit chips on the back side of the substrate wafer.

15. The process of claim 11, wherein the support wafer has a raised rim with an inner circumferential surface and the porous silicon weak surface layer is formed along the inner circumferential surface and attached to a peripheral edge of the substrate wafer.

16. The process of claim 15, wherein destroying comprises performing an electrochemical etch on the silicon wafer to remove the porous silicon region.

17. A process, comprising:
producing front-side parts for integrated-circuit chips at locations on a substrate wafer, said front-side parts having a front side;
adhesively attaching a silicon support wafer to the substrate wafer, said silicon support wafer having a raised rim formed around a circumference of the silicon support wafer, an inner surface of the raised rim having a layer thereon of a porous silicon, said adhesively attaching comprising adhering the porous silicon layer of said support wafer to a peripheral edge of the substrate wafer;
processing a back side of the substrate wafer; and
destroying the porous silicon layer of the support wafer so as to demount the support wafer from the substrate wafer.

18. The process of claim 17, wherein processing the back side of the substrate wafer comprises thinning the substrate wafer from the back side.

19. The process of claim 17, wherein processing the back side of the substrate wafer comprises forming vias from the back side.

20. The process of claim 17, wherein processing the back side of the substrate wafer comprises producing back-side parts of the integrated-circuit chips on the back side of the substrate wafer.

21. The process of claim 17, wherein destroying comprises performing an electrochemical etch on the silicon wafer to remove the porous silicon raised rim.

* * * * *